United States Patent
Kim

(10) Patent No.: US 8,530,925 B2
(45) Date of Patent: Sep. 10, 2013

(54) LIGHT EMITTING DEVICE PACKAGE AND LIGHTING SYSTEM INCLUDING THE SAME

(75) Inventor: Hye Young Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 93 days.

(21) Appl. No.: 13/037,868

(22) Filed: Mar. 1, 2011

(65) Prior Publication Data
US 2011/0220926 A1 Sep. 15, 2011

(30) Foreign Application Priority Data
Mar. 9, 2010 (KR) .................. 10-2010-0020647

(51) Int. Cl.
H01L 29/22 (2006.01)
H01L 33/00 (2010.01)
H01L 31/0203 (2006.01)
H01L 29/227 (2006.01)

(52) U.S. Cl.
USPC ............. 257/99; 257/98; 257/433; 257/434; 257/E33.056; 257/E33.057; 257/E33.058; 257/E33.059

(58) Field of Classification Search
USPC ............. 257/98, E33.056, E33.061, 99, 433, 257/434, E33.057, E33.058, E33.059
See application file for complete search history.

(56) References Cited

U.S. PATENT DOCUMENTS

| | | | | |
|---|---|---|---|---|
| 6,563,782 | B1* | 5/2003 | Oumi et al. | 369/126 |
| 7,129,163 | B2* | 10/2006 | Sherrer et al. | 438/637 |
| 7,476,913 | B2* | 1/2009 | Isobe et al. | 257/98 |
| 7,907,801 | B2* | 3/2011 | Kodama et al. | 385/14 |
| 7,997,749 | B2* | 8/2011 | Kim et al. | 362/97.3 |
| 2003/0034438 | A1* | 2/2003 | Sherrer et al. | 250/216 |
| 2003/0183920 | A1* | 10/2003 | Goodrich et al. | 257/701 |
| 2007/0081313 | A1* | 4/2007 | Tanaka et al. | 361/767 |
| 2008/0251287 | A1* | 10/2008 | Shiraishi et al. | 174/262 |
| 2009/0230417 | A1* | 9/2009 | Tsai et al. | 257/98 |
| 2009/0289272 | A1* | 11/2009 | Kim et al. | 257/98 |
| 2011/0211351 | A1* | 9/2011 | Van De Ven et al. | 362/249.02 |
| 2011/0215353 | A1 | 9/2011 | Won et al. | |
| 2011/0248311 | A1 | 10/2011 | Kim et al. | |

FOREIGN PATENT DOCUMENTS

| | | |
|---|---|---|
| JP | 2007-281037 A | 10/2007 |
| KR | 10-2009-0021531 A | 3/2009 |
| WO | WO 2009/142391 A2 | 11/2009 |

* cited by examiner

*Primary Examiner* — Zandra Smith
*Assistant Examiner* — Tsz Chiu
(74) *Attorney, Agent, or Firm* — McKenna Long & Aldridge LLP

(57) ABSTRACT

Provided are a light emitting device package and a lighting system including the same. The light emitting device package includes: a body, a plurality of electrode layers, a light emitting device, and a molding member. The body includes a plurality of pits. The electrode layers include first protrusions disposed in the pits, and second protrusions protruding in a direction opposite to the first protrusions. The light emitting device is disposed on at least one of the plurality of electrode layers. The molding member is disposed on the light emitting device.

20 Claims, 9 Drawing Sheets

LIGHT EMITTING DEVICE PACKAGE AND LIGHTING SYSTEM INCLUDING THE SAME

CROSS-REFERENCE TO RELATED APPLICATIONS

The present application claims priority under 35 U.S.C. §119(a) of Korean Patent Application No. 10-2010-0020647 filed on Mar. 9, 2010, which is hereby incorporated by reference in its entirety as if fully set forth herein.

BACKGROUND

The embodiment disclosure relates to a light emitting device package and a light system including the same.

Light Emitting Diodes (LEDs) are semiconductor light emitting devices that convert a current into light. As the luminance of LED increases, LEDs are being increasingly used as light sources for displays, vehicles, and lightings. Also, LEDs emitting white light of high-efficiency can also be implemented by using fluorescent substances or combining various colors of LEDs.

Various methods for improving a light extraction structure, a structure of an active layer, current diffusion, a structure of an electrode, and a structure of an LED package are being studied to improve the luminance and performance of LEDs.

SUMMARY

Embodiments provide a light emitting device package having a new light extraction structure.

Embodiments provide a light emitting device package including an electrode layer having a plurality of second protrusions on a body.

Embodiments provide a light emitting device package including an electrode layer having a first protrusion lower than the top surface of a body and a second protrusion higher than the top surface of the body.

Embodiments also provide a light emitting device package that can improve the reliability of a light emitting device package and a light system.

In one embodiment, a light emitting device package includes: a body including a plurality of pits; a plurality of electrode layers on the body, the plurality of electrode layers including first protrusions disposed in the pits and second protrusions protruding in a direction opposite to the first protrusions; a light emitting device on at least one of the plurality of electrode layers; and a molding member on the light emitting device.

In another embodiment, a light emitting device package includes: a body including a cavity upwardly opened, and a plurality of pits on a bottom surface of the cavity; an insulation layer on a surface of the body; a plurality of electrode layers on the insulation layer, the plurality of electrode layers including first protrusions disposed in the pits and second protrusions protruding in a direction opposite to the first protrusions; a light emitting device on at least one of the plurality of electrode layers; and a molding member on the light emitting device.

In further another embodiment, a lighting system includes: a plurality of light emitting device packages; a board on which the plurality of light emitting device packages are disposed; and an optical member on the board, wherein the light emitting device package includes: a body including a plurality of pits; a plurality of electrode layers on the body, the plurality of electrode layers including first protrusions disposed in the pits and second protrusions protruding in a direction opposite to the first protrusions; a light emitting device on at least one of the plurality of electrode layers; and a molding member on the light emitting device.

The details of one or more embodiments are set forth in the accompanying drawings and the description below. Other features will be apparent from the description and drawings, and from the claims.

DETAILED DESCRIPTION OF THE EMBODIMENTS

Figure 1:
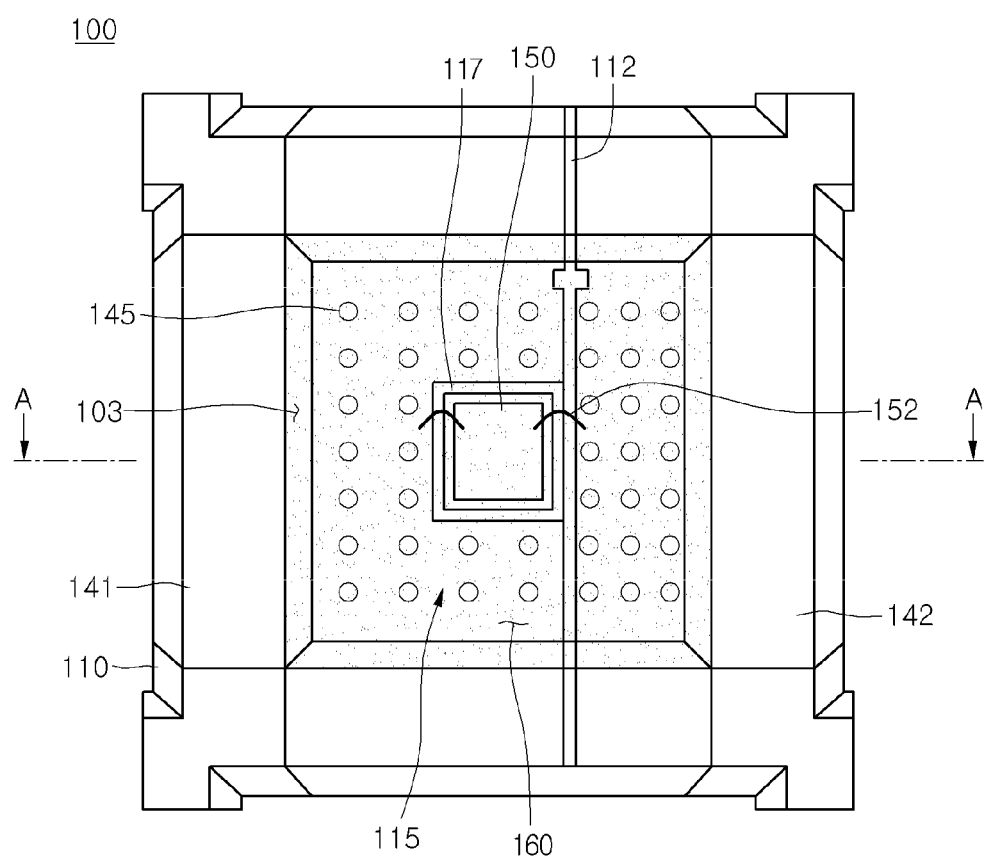
FIG. 1 is a plan view illustrating a light emitting device package according to a first embodiment.

Reference will now be made in detail to the embodiments of the present disclosure, examples of which are illustrated in the accompanying drawings.

In addition, the terms "first" and "second" can be selectively or exchangeably used for the members. In the figures, a dimension of each of elements may be exaggerated for clarity of illustration, and the dimension of each of the elements may be different from an actual dimension of each of the elements. Not all elements illustrated in the drawings must be included and limited to the present disclosure, but the elements except essential features of the present disclosure may be added or deleted. Also, in the descriptions of embodiments, it will be understood that when a layer (or film), a region, a pattern, or a structure is referred to as being 'on/above/over/upper' substrate, each layer (or film), a region, a pad, or patterns, it can be directly on substrate each layer (or film), the region, the pad, or the patterns, or intervening layers may also be present. Further, it will be understood that when a layer is referred to as being 'under/below/lower' each layer (film), the region, the pattern, or the structure, it can be directly under another layer (film), another region, another pad, or another patterns, or one or more intervening layers may also be present. Therefore, meaning thereof should be judged according to the spirit of the present disclosure.

Figure 2:
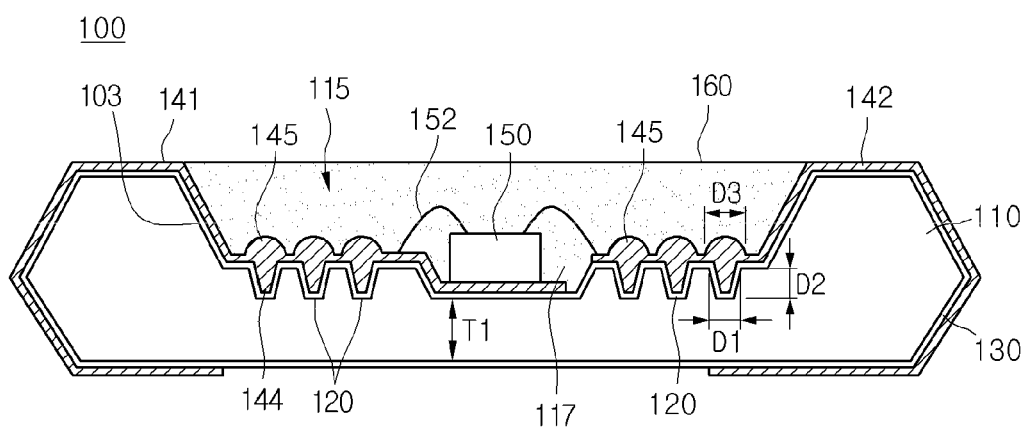
FIG. 2 is a side cross-sectional view take along line A-A of FIG. 1.

FIG. 1 is a plan view illustrating a light emitting device package according to a first embodiment. FIG. 2 is a side cross-sectional view take along line A-A of FIG. 1.

Referring to FIGS. 1 and 2, a light emitting device package 100 may include a body 110 including a plurality of pits 120, first and second electrode layer 141 and 142 including a plurality of first protrusions 144 and second protrusions 145, an insulation layer 130, a light emitting device 150, and a molding member 160.

The body 110 may include a conductive material, for example, silicon (Si). The body 110 may include materials other than silicon (Si), for example, resin, semiconductor, metal, or ceramic materials, but embodiments are not limited thereto.

The body 110 may be etched using a bulk etching method as an etching process. The etching method may include wet etching, dry etching, laser drilling, and a combination thereof. There is a deep reactive ion etching method as a representative method of dry etching.

A cavity 115 upwardly opened may be formed in the body 110. The cavity 115 may be formed in a certain depth from the top surface of the body 110. The cavity 115 may have at least one of base tube shape, polygonal shape, or circular shape as a recessed portion or hole, but embodiments are not limited thereto. The cavity may be formed by patterning a mask and then using anisotropic wet etchant such as KOH solution, TMAH, and EDP.

The body 110 may be injection-molded using high reflection resin material (e.g., PPA). An electrode layer may be formed on the surface of the body by an electroplating method, but embodiments are not limited thereto. The cavity 115 of the body 110 may be formed through injection molding, but embodiments are not limited thereto.

The cavity 115 may not be formed. In this case, the surface of the body 110 may be formed to have a flat top surface, but embodiments are not limited thereto.

The side surface 103 of the cavity 115 of the body 110 may be inclined at a certain angle or curvature with respect to the vertical axis of the lower surface of the body 110. In one embodiment, the side surface 103 of the cavity 115 of the body 110 may be formed to be vertical to the lower surface of the body 110, but embodiments are not limited thereto.

The body 110 has a first side surface inclined at a certain angle with respect to the top surface of the body 110 and a second side surface inclined at a certain angle with respect to the lower surface of the body 110. The first side surface and the second side surface are connected to each other. The interior angle between the first side surface and the second side surface may be about 30 degrees to about 80 degrees.

The body 110 may include the plurality of pits 120 on at least a portion of the top surface thereof. The at least a portion of the top surface may include a region other than a region where a light emitting device is mounted. The plurality of pits may be formed on the bottom surface of the cavity except a recess 117. The plurality of pits 120 may be formed under the top surface of the body 110, preferably, the bottom surface of the cavity 115, but embodiments are not limited thereto. The recess 117 may not be formed.

The plurality of pits 120 may be formed in a circular shape when viewed from the top, or may be formed in a polygonal shape or random shape.

The plurality of pits 120 may be formed to have a certain depth D2 in a direction of the bottom surface of the cavity 115 to the lower surface of the body 110. The depth D2 may range from about 1 μm to about 30 μm.

The pit 120 may be formed to a cylindrical or cone shape that has a greater width at an upper end than a width at a lower end. The width D1 at the upper end of the pit 120 may be the maximum width of the pit. At least one surface of the pit 120 may be formed to incline to the lower surface of the body 110.

At least one of the plurality of pits 120 may be formed to have a width D1 and a depth D2. For example, the ratio of the D1 to D2 may range from about 1:1 to about 1:3.

The plurality of pits 120 may be regularly or irregularly arrange. The plurality of pits 120 may have different depths, widths, and sizes, but embodiments are not limited thereto.

The recess 117 of the cavity 115 is a region where the light emitting device 150 is disposed, and may be formed to have a stepped structure with respect to the bottom surface of the cavity 115. The thickness between the recess 117 and the lower surface of the body 110 may be smallest among the thickness of the body 110. That is, a region of the bottom surface of the cavity 115 where the light emitting device 150 is disposed is closer to the lower surface of the body than a region where the fits 120 are not formed. Accordingly, the discharging efficiency of the light emitting device 150 may be improved. In another embodiment, the recess 117 may be at the same plane as the bottom surface of the cavity 115, but embodiments are not limited thereto.

The insulation layer 130 may be disposed on the surface of the body 110, and may extend to the top surface, side surface, and lower surface of the body 110. The insulation layer 130 may be disposed between the electrode layers 141 and 142 and the body 110, and may prevent a contact between the electrode layers 141 and 142 and the body 110.

The insulation layer 130 may include at least one of $SiO_2$, $Si_xO_y$, $AlO_x$, $Si_3N_4$, $Si_xN_y$, $SiO_xN_y$, AlN, and $Al_2O_3$, but embodiments are not limited thereto.

The insulation layer 130 may extend to the surface of each pit 120 to prevent a contact between the body 110 and the electrodes 141 and 142 in the fit 110. In one embodiment, when the body 110 is formed of an insulating material, the insulation layer 130 may not be formed in the pit 120.

At least one electrode layer may be formed on the insulation layer 130. For convenience of explanation, however, a plurality of electrode layers 141 and 142 may be formed.

The plurality of electrode layers 141 and 142 may be formed in at least one layer using metal material, but may be formed in multi-layer of metal in an embodiment. The plurality of electrode layers 141 and 142 may include Ti, Cr, Ta, Cu, Au, Ag, Al, Pt, Ni, Ti-alloy, Cr-alloy, Cu-alloy, Ag-alloy, and Al-alloy, but embodiments are not limited thereto.

On the other hand, the plurality of electrode layers 141 and 142 may extend to the top surface, side surface, and lower surface of the body 110. The plurality of electrode layers 141 and 142 may be separated by an open region 112 over the body 110, and may be separated by the open region 112 under the body 110.

The plurality of electrode layers 141 and 142 may be formed on the whole region of the bottom surface and side surface of the cavity 115 except the open region 112. Accordingly, the reflection efficiency can be improved in the cavity 115.

The plurality of electrode layers 141 and 142 may be disposed on the top surface of the body 110 to reflect light incident to the top surface of the body 110.

At least one of the plurality of electrode layers 141 and 142 may include a first protrusion 144 and a second protrusion 145. The second protrusion 145 may be disposed in the cavity 115 to protrude from the bottom surface of the cavity. The protrusion direction of the second protrusion 145 may be identical to the thickness direction of the body 110.

The second protrusion 145 may be formed in plurality in the electrode layers 141 and 142. The plurality of second protrusions 145 may be arranged at a regular or irregular interval. The plurality of protrusions 145 may be formed to have a regular or irregular size. The plurality second protrusions 145 may be arranged in a prominent pattern on the top surface of the electrode layers 141 and 142 to be used as a light extraction structure.

The first protrusion 144 may be disposed in at least one pit 120 to which a portion of the electrode layers 141 and 142 may extend. The first protrusion 144 may be disposed in each pit 120, and may be disposed on the insulation layer 130. The width D3 of the lower end of the second protrusion 145 may be greater than the width D1 of the upper end of the first protrusion 144. In other words, the area of the upper portion of the first protrusion 144 may be greater than the area of the lower portion of the first protrusion 144.

The area of the lower portion of the second protrusion 145 may be greater than the area of the upper portion of the first protrusion 144 or the pit 120. The second protrusions 145 may protrude from the pits 120, corresponding to each pit 120. The first protrusion 144 has a pillar shape in which an upper portion of the first protrusion 114 has an area greater than an area of a lower portion of the first protrusion 114.

The side section of the second protrusion 145 may have a convex lens, hemispherical, dome, and polygonal shapes. The width D3 of the second protrusion 145 may range from about 1 μm to about 30 μm. The height of the second protrusion 145 may protrude from the flat top surface of the electrode layers 141 and 142 by about 1 μm to about 30 μm. The interval between the second protrusions 145 may correspond to the interval between the pits 120.

The light emitting device 150 may be disposed on the first electrode layer 141. In one embodiment, the light emitting device may be disposed on the second electrode layer 142 or may be mounted on the first and second electrode layers 141 and 142. The light emitting device 150 may be disposed on the bottom surface of the cavity 115, but embodiments are not limited thereto. Hereafter, for convenience of explanation, a structure in which the light emitting device 150 is disposed on the recess 117 of the first electrode layer 141 will be described as an example.

The light emitting device 150 may be bonded to the first with paste (not shown), or may be bonded by a die-attach method. Here, the light emitting device 150 may emit a certain wavelength of light, for example, may include an LED chip emitting light of a visible band such as blue LED chip, green LED chip, red LED chip, and yellow LED chip, or an LED chip emitting light of an ultraviolet band.

The light emitting device 150 may include compound semiconductor materials of Group III-V, for example, semiconductor materials having a chemical formula of $In_xAl_yGa_{1-x-y}N$ ($0 \leq x \leq 1$, $0 \leq y \leq 1$, $0 \leq x+y \leq 1$).

The light emitting device 150 may be disposed in singularity or plurality in the cavity 115, but embodiments are not limited thereto.

The light emitting device 150 may be electrically connected to the first electrode layer 141 and the second electrode layer 142. The light emitting device 150 may be connected to the first electrode layer 141 and the second electrode layer 142 through wire. In one embodiment, the light emitting device 150 may be connected to the first electrode layer 141 and the second electrode layer 142 by a bonding method such as a wire, die, and flip method.

A molding member 160 may be disposed in the cavity 115. The molding member 160 may be formed of light-transmitting resin or glass, preferably, resin such silicon or epoxy. The molding member 160 may cover the light emitting device 150, and may have the same thickness as the cavity 115.

The top surface of the molding member 160 may include at least one of concave, flat, and convex shapes, and a light extraction structure such as an unevenness structure may be further disposed therein.

At least one kind of fluorescent substance may be added to the molding member 160, and the fluorescent substance may selectively include red, green, and yellow substances, but embodiments are not limited thereto. The fluorescent substances may include at least one of YAG, TAG, Silicate, Nitride, Oxynitride-based material.

The fluorescent substance may be coated on the top surface of the light emitting device 150, or may be coated on the surface of the molding member 160, but embodiments are not limited thereto. Also, a fluorescent film may be disposed over or under the molding member 160, but embodiments are not limited thereto.

The molding member 160 may be formed in multilayer. At least one layer of the molding member 160 may be a transparent resin layer without fluorescent substance, and the other layers may be a layer with fluorescent substance.

A lens (not shown) may be disposed over the cavity 115. The lens may have a convex lens shape on the molding member 160. The lens may be formed separately from or integrally with the molding member 160.

The second protrusion 145 of the first and second electrode layers 141 and 142 may diffusely reflect light directly or indirectly incident into the cavity 15, thereby improving the light extraction efficiency.

On the other hand, when formed of silicon, the body 110 may include at least one doped region. The doped region may be a region in which at least one kind of conductive-type dopant is implanted or diffused. The doped region may be electrically connected to at least one of the plurality of electrode layers 141 and 142 to be implemented in a protective device such as Zener diode or a switching device such as TFT.

The doped region may be disposed on the top surface and/or the lower surface of the body 110. The conductive-type dopant may include dopant having a polarity opposite to that of the body 110.

The plurality of electrode layers 140 and 141 may be formed in a multilayer, which will be described in detail below.

Figure 3:
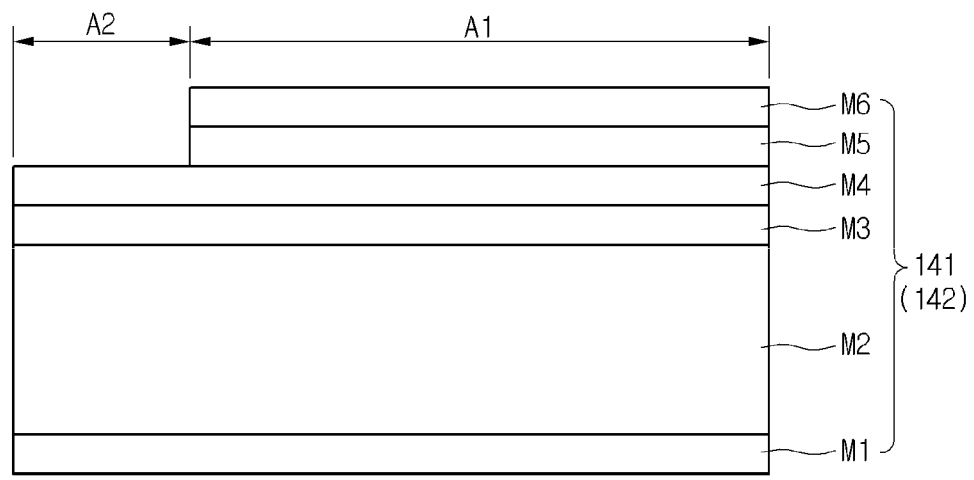
FIG. 3 is a detailed cross-sectional view illustrating an electrode layer of FIG. 1.

Referring to FIG. 3, the plurality of electrode layers 141 and 142 may include a seed layer M1, a conductive layer M2, a barrier layer M3, a bonding layer M4, an adhesive layer M5, and a reflection layer M6.

The plurality of electrode layers 141 and 142 may be stacked as different metal layers in each region. For example, a first region A1 may be a reflection region, and may be a region in which the light emitting device is not mounted. A second region A2 may be a region in which the light emitting device is mounted or a solder paste is disposed.

The seed layer M1 may be formed on the insulation layer 130 by a deposition method such as sputtering method or E-beam deposition method, and the conductive layer M2, the barrier layer M3, the bonding layer M4, the adhesive layer M5, and the reflection layer M6 may be formed by a plating (e.g., electroplating) method.

In the forming of the first and the second electrode layers 141 and 142, a photoresist may be coated, and exposed, developed, and patterned to expose a selected region, and then each metal layer is formed, or the patterning process may be performed after each metal layer is formed. Such a photoresist process may be modified within the spirit and scope of the present invention.

The seed layer M1 may be formed in single- or multi-layer including a material having excellent adhesion with other insulation layers and metal layers, for example, Ti, Cr, and Ta. The seed layer M1 may be formed to have a thickness of about 900 Å ± 200 Å.

An intermediate seed layer may be disposed between the seed layer M1 and the conductive layer M2. The intermediate seed layer may be formed of Au or Cu. Accordingly, the seed layer M1 may include a structure of Cr/Au, Cr/Cu, Ti/Au, Ta/Cu, or Ta/Ti/Cu. Here, the intermediate seed layer may be formed to have a thickness of about 6000 Å±500 Å by a physical deposition method.

The conductive layer M2 may be disposed on the seed layer M1. The conductive layer M2 may be thicker than other metal layers. The conductive layer M2 may be formed by a plating method. The plating method may alleviate a stress with the seed layer M1 that is deposited by the deposition method. The alleviation of the stress may retrain the surface roughness of the conductive layer M2 from increasing. That is, the conductive layer M2 may restrain the stress due to a difference from the method for forming the seed layer M1.

The conductive layer M2 may be formed of a metal having excellent thermal conductivity and heat-radiation characteristics, for example, Cu. The conductive layer M2 may be formed to have a thickness of several tens of micrometers or less, for example, 30 µm or less, preferably, 10 µm or less. Also, the conductive layer M2 may be formed of a material such as Ag, Au, and Al other than Cu, and may include Cu-alloy and Ag-alloy.

The conductive layer M2 may be disposed in the region of the cavity 115, the top surface, side surface and lower surface of the body 110, thereby efficiently radiating heat generated in the light emitting device 150.

The barrier layer M3 may be disposed on the conductive layer M2. The barrier layer M3 may be disposed between the conductive layer M2 and the bonding layer M4 to block the electrical characteristics of the bonding layer M4 from being reduced by the conductive layer M2. The barrier layer M3 may be formed by a plating method using Pt and Ni, and may have a thickness of about 3000 Å±500 Å.

The bonding layer M4 may be disposed on the barrier layer M3. The bonding layer M4 may be formed by a plating method using Au, and may have a thickness of about 5000 Å±500 Å.

When the conductive layer M2, the barrier layer M3, and the bonding layer M4 are formed of Cu, Ni, and Au, respectively, the stack structure may be selected from Cr/Au/Cu/Ni/Au, Cr/Cu/Cu/Ni/Au, Ti/Au/Cu/Ni/Au, Ta/Cu/Cu/Ni/Au, and Ta/Ti/Cu/Cu/Ni/Au The adhesive layer M5 and the reflection layer M6 are disposed on the bonding layer M4. The adhesive layer M5 may be formed for junction between adjacent two metals. The bonding layer M4 may be formed of Ti, Cr, or Ta, and may have a thickness of about 900 Å±100 Å. The adhesive layer M5 may not be formed.

The reflection layer M6 may be disposed on the adhesive layer M5. The reflection layer M6 may be formed of metals or an alloy thereof having excellent reflectance to reflect light, for example, Al, Ag, or an alloy thereof. Since the reflection layer M6 is formed in the cavity 115, the light reflection efficiency can be improved. The reflection layer M6 may have a thickness of about 1500 Å±300 Å.

The electrode layers 141 and 142 may be formed to have different stack structures in the cavity 115.

The second region A2 may include a plurality of first metal layers M1 to M4, and the first region A1 may further include a plurality of second metal layers M5 and M6 on the first metal layers M1 to M4. The first region A1 may be a region different from the second region A2. The second region A2 may be a portion of the region of the first electrode layer disposed in the recess 117 of FIG. 1. The second region A2 may include at least four metal layers, and may not include the pits and the second protrusions.

The first region A1 may include at least six metal layers, and may include a plurality of pits and second protrusions. In the second region A2, a metal layer for bonding junction may be exposed, and in the first region A1 except the second region A2, a metal layer having excellent reflection characteristics may be exposed.

The second region A2 in the cavity 115 may include a stack structure of the seed layer M1, the conductive layer M2, the barrier layer M3, and the bonding layer M4. The first region A1, which is a reflection region, may include a stack structure in which the adhesive layer M5 and the reflection layer M6 are stacked on the bonding layer M4.

The bonding layer M4 may be disposed in the second region A2 of the cavity 115 using a mask pattern, and the light emitting device 150 may be mounted on the bonding layer M4.

Here, the surface roughness of the bonding layer M4 may be formed to have a density and a thickness lower than the surface roughness of the reflection layer M6. Accordingly, the adhesion between the bonding layer M4 and the paste can be improved. As the surface roughness of the bonding layer M4 increases, the thermal conductivity may be reduced due to influx of air into a junction interface. The surface roughness of the bonding layer M4 may range from several nanometers to several tens of nanometers, thereby improving the junction characteristics and thermal conductivity.

FIGS. 4 to 7 are views illustrating a process of fabricating a light emitting device package according to a first embodiment.

Figure 4:
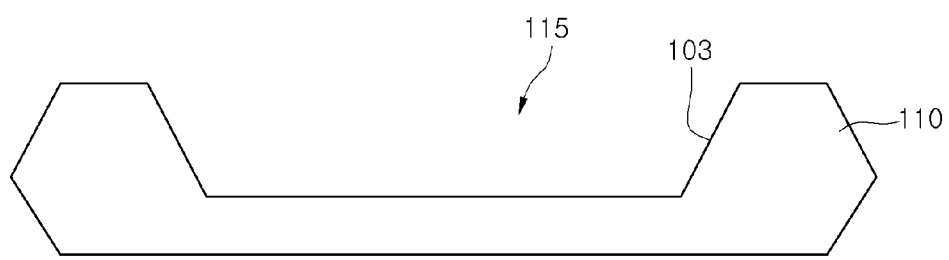
FIGS. 4 to 7 are views illustrating a process of fabricating a light emitting device package of FIG. 1.
Figure 5:
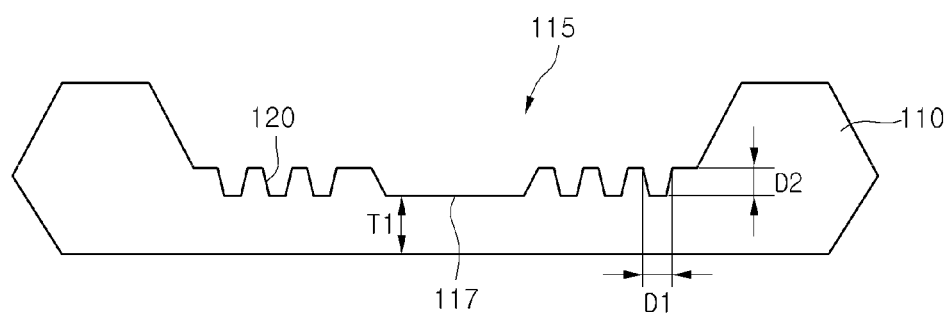

Referring to FIGS. 4 and 5, a mask pattern may be formed on a region of the top surface of a body 110 except an etching region, and then etching is performed on a region where the mask pattern is not formed. A cavity 115 may be formed by the above etching process. The body 110 may be formed of a silicon-based material, or may be formed using a substrate including, for example, resin, semiconductor, metal, and ceramic materials, but embodiments are not limited thereto.

The cavity 115 may be upwardly opened, and may be formed to have a depth of two times or more of the thickness of a light emitting device. The cavity 115 may have one of base tube, polygonal, and circular shapes, but embodiments are not limited thereto. The method for forming the cavity 115 may include forming a mask pattern, and then processing a wafer of a body material using a chemical etching method such as Tetra methyl ammonium hydroxide (TMAH) and Ethylen Diamine pyrocatechol (EDP), and a wet etchant such as KOH solution. For the chemical etching method, isotropic etching showing uniform etching characteristics regardless of the orientation of crystal plane, or anisotropic etching showing different etching characteristics according to the orientation of the crystal plane of the wafer material may be used.

In one embodiment, the body 110 may be formed by injection-molding using a high reflection resin material (e.g., PPA). The cavity 115 may not be formed, but embodiments are not limited thereto.

Figure 6:
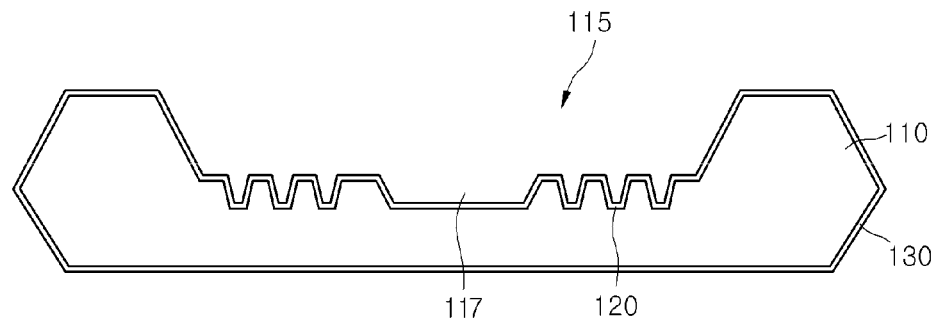

Referring to FIGS. 5 and 6, a plurality of pits 120 may be formed in a certain region of the top surface of the body 110. For example, the plurality of pits 120 may be formed on the bottom surface of the cavity 115 by an etching process.

The plurality of pits 120 may be formed by coating a photoresist through a photo-lithography process, exposing and developing it, and then performing a dry or wet etching method on a selected region.

The plurality of pits 120 may be formed on the bottom surface of the cavity 115 except a recess 117, that is, a region where the light emitting device is to be mounted.

The plurality of pits 120 may be formed to have a certain depth in a direction from the bottom surface of the cavity 115 to the lower surface of the body 110. The depth D2 of the pit 120 may range from about 1 μm to about 30 μm. The depth D2 of the pit 120 may be greater than the width D1 thereof. For example, the ratio of the depth D2 to the width D1 may range from about 1:1 to about 1:3. The width D1 may be a width of the upper end of each pit 120, and the width of the upper end may be greater than a width of the lower end of each pit 120.

The pit 120 may have a circular or polygonal shape when viewed from the top, but embodiments are not limited thereto.

The plurality of pit 120 may be regularly or irregularly arranged. The widths of the pit 120 may be identical to or different from each other.

The recess 117 of the cavity 115 may have a stepped structure with respect to the bottom surface of the cavity 115. The thickness T1 of the body may be smallest at the recess 117. Accordingly, the heat-radiation efficiency of the light emitting device can be improved. In one embodiment, the recess 117 may be formed to have the same plane as the bottom surface of the cavity 115, but embodiments are not limited thereto.

Figure 7:
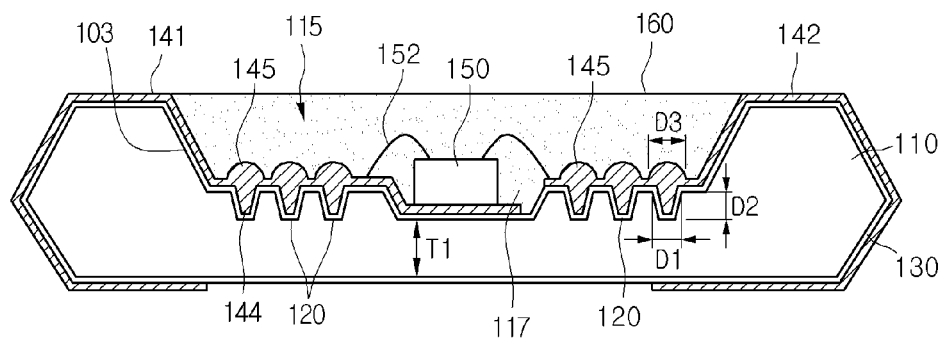

Referring to FIGS. 6 and 7, an insulation layer 130 may be formed on the surface of the body 110. The insulation layer 130 may be formed by a deposition method such as sputtering or E-beam deposition. For example the insulation layer 130 may be formed of insulation materials such as silicon thermal oxide ($SiO_2$, $Si_xO_y$, etc.), aluminum oxide ($AlO_x$), silicon nitride ($Si_3N_4$, $Si_xN_y$, $SiO_xN_y$, etc.), alumina (AlN), and $Al_2O_3$, but embodiments are not limited thereto. The insulation layer 130 may be omitted when the body 110 is formed of an insulation material.

A plurality of electrode layers 141 and 142 may be formed on the insulation layer 130. The plurality of electrode layers 141 and 142 may include a multilayer of metal layer, for example, a stack structure of the seed layer M1, the conductive layer M2, the barrier layer M3, the bonding layer M4, the adhesive layer M5, and the reflection layer M6 as shown in FIG. 3.

The seed layer M1 may be formed on the insulation layer 130 by a physical deposition method such as sputtering or E-beam deposition. The conductive layer M2, the barrier layer M3, the bonding layer M4, the adhesive layer M5, and the reflection layer M6 may be formed by a plating method (e.g., electroplating)

In the forming of the first and the second electrode layers 141 and 142, a photoresist may be coated, and exposed, developed to select a metal layer region, and then each metal layer is formed. In one embodiment, a patterning process may be performed to form an open region after each metal layer is formed. Such a photoresist process may be modified within the spirit and scope of the present invention.

The seed layer M1 may be formed in single- or multi-layer including a material having excellent adhesion with the insulation layer 130 and other metal layers, for example, Ti, Cr, and Ta.

An intermediate seed layer may be formed on the seed layer M1. The intermediate seed layer may be formed of Au or Cu. Accordingly, the seed layer M1 may include a structure of Cr/Au, Cr/Cu, Ti/Au, Ta/Cu, or Ta/Ti/Cu.

The conductive layer M2 may be disposed on the seed layer M1. The conductive layer M2 may be formed by an electroplating method. The electroplating method may alleviate a stress with the seed layer M1 that is deposited by the deposition method. The alleviation of the stress may retrain the surface roughness of the conductive layer M2 from increasing. That is, the conductive layer M2 may restrain the stress due to a difference from the method for forming the seed layer M1.

The electroplating method of the conductive layer M2 may include alternately changing a supplied pulse in forward and backward direction, which will be described later.

The conductive layer M2 may be formed of a metal having excellent thermal conductivity and heat-radiation characteristics, for example, Cu. The conductive layer M2 may be formed to have a thickness of, for example, 30 μm or less, preferably, 10 μm or less. Also, when the thickness of the conductive layer M2 is several micrometers or more, the surface roughness of the conductive layer M2 may range from about 1 μm to about 30 μm. When the thickness of the conductive layer M2 is about 10-30 μm, the heat-radiation characteristics and the surface roughness can be improved.

The conductive layer M2 may extend from the bottom surface of the cavity 115 to the lower surface of the body 110, and may efficiently conduct heat generated in the light emitting device 150.

The barrier layer M3 may be formed on the conductive layer M2. The barrier layer M3 may block the electrical characteristics of the bonding layer M4 from being reduced by the conductive layer M2 in a high-temperature environment. The barrier layer M3 may be formed by a plating method using Pt and Ni.

The bonding layer M4 may be formed on the barrier layer M3. The bonding layer M4 may be formed by a plating method using Au.

The adhesive layer M5 and the reflection layer M6 may be stacked on the bonding layer M4. The adhesive layer M5 may be formed of Ti, Cr, and Ta, and may have a thickness of about 900 Å±100 Å.

The reflection layer M6 may be formed on the adhesive layer M5. The reflection layer M6 may be formed of reflection metal or an alloy thereof. Since the reflection layer M6 is formed on the bottom surface and the side surface of the cavity, the light reflection efficiency can be improved. The reflection layer M6 may have a thickness of about 1500 Å±300 Å

The surface roughness of the bonding layer M4 and the reflection layer M6 may correspond to the surface roughness of the conductive layer M2, and may be formed to have a range from about 1 nm to about 30 nm.

In the electroplating process of the conductive layer M2, when the electroplating process is performed using a material of the conductive layer M2, for example, Cu plating solution, a current may be alternately applied in a forward pulse and a backward pulse. The Cu plating solution may be plated from the lower portion of the pit 120, and the inside of the pit 120 may be completely filled by super filling. After the plating is completed, second protrusions 145 may protrude from each pit 120.

The current of the backward pulse rather than the forward pulse is applied strongly and shortly. In this case, the conductive layer M2 may upwardly protrude from the inside of the pit 120 while the plating is being performed on the seed layer in the pit 120. Here, the electrode layers 141 and 142 may include first protrusions 144 formed in each pit 120. The first protrusions 144 may protrude in the opposite direction to the second protrusion 145. The first protrusion 144 may be formed to have a range from about 1 μm to about 30 μm. The ratio of the depth to the diameter thereof may range from about 1:1 to about 1:3.

The electroplating process may be performed in a plating solution of about 40-60 g/L Cu concentration. Also, the electroplating process may be performed at the pulse period of forward current/backward of about 90 ms/10 ms, and at the forward/backward current density of about 1ASD/2ASD. The above condition of the present embodiment may be changed according to the depth and width of the pit, plating solution, and current conditions.

Here, the conductive layer M2 may protrude from the inside of the pit 120 over the bottom surface of the cavity 115. Thus, the barrier layer M3 and the bonding layer M4 may be formed outside the pit 120, not inside the pit 120, and may be preferably formed at a position higher than the bottom surface of the cavity 115.

The second protrusions 145 may be arranged at a regular or irregular interval, and may have a constant or random size.

The height and shape of the second protrusions 145 may vary according to the period and the size of the current. The second protrusion 145 may have a lens, hemisphere, dome, or polygonal shape. The height or the diameter thereof may range from about 1 μm to about 30 μm. The second protrusion 145 may have the maximum diameter at the lower portion thereof.

The shape, height, and diameter of the second protrusion 145 may vary according to the shape of the pit 120. For example, when the pit 120 has a diameter of about 1 μm and a length of about 30 μm, the second protrusion 135 may be formed to have a width greater than the width of the upper end of the pit 120.

Here, in the forming of the plurality of the electrode layers, a plating method of applying a current in a forward direction and a backward direction may be performed on the conductive layer among the conductive layer, the bonding layer, the adhesive layer, and the reflection layer, and a typical plating method, sputtering, or deposition method may be performed on the other layers, but embodiments are not limited thereto.

On the other hand, at least one doped region may be formed in the body 110 before or after the forming of the insulation layer 130, and the doped region may be formed by a process of implanting or diffusing conductive-type dopant into the top surface and/or the lower surface of the body. The doped region may be electrically connected to at least one of the plurality of electrode layers 141 and 142 to be implemented in a protective device such as a Zener diode, or a constant current device.

Referring to FIG. 7, the light emitting device 150 may be disposed on the first electrode layer 141 and/or the second electrode layer 142. The light emitting device 150 may also be disposed on the body 110 or the insulation layer 130. Hereinafter, for convenience of explanation, a structure in which the light emitting device 150 is disposed on the recess 117 of the first electrode layer 141 will be described as an example.

The light emitting device 150 may be bonded to the bonding layer of the first electrode layer 141 formed in the recess 117 using paste (not shown), or may be bonded by a die-attach method. Here, the light emitting device 150 may include a color LED chip such as a blue LED chip, a green LED chip, a red LED chip, and a yellow LED chip, or an ultraviolet (UV) LED chip. Here, the type and number of the light emitting device 150 are not limited.

The light emitting device 150 may be electrically connected to the first electrode layer 141 and the second electrode layer 142, for example, by at least one wire 152, die-bonding, or flip bonding, but the embodiment may be variously modified within the spirit and scope of the present invention.

A molding member 160 is formed in the cavity 115, and may include light-transmitting resin, for example, resin materials such as silicon and epoxy. The surface of the molding member 160 may be formed to have any one of a concave, flat, and convex shapes. The molding member 160 may include at least one kind of fluorescent substance, which may selectively include red, green, and yellow fluorescent substances, but embodiments are not limited thereto.

A lens (not shown) may be formed on the cavity 115. The lens may have a convex lens shape on the molding member 160. The lens may be formed separately from or integrally with the molding member 160. The lens may be modified for light extraction efficiency. The fluorescent film including at least one kind of fluorescent substance may be disposed on the cavity 115, but embodiments are not limited thereto.

The second protrusions 145 of the first and second electrode layers 141 and 142 may be disposed around the light emitting device 150 may diffusely reflect incident light, thereby improving the light efficiency.

Figure 8:
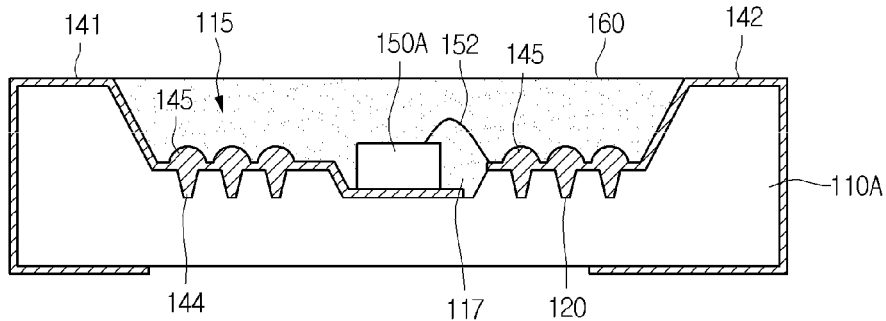
FIG. 8 is a side cross-sectional view illustrating a light emitting device package according to a second embodiment.

FIG. 8 is a side cross-sectional view illustrating a light emitting device package according to a second embodiment. To explain the second embodiment, parts identical to the first embodiment will be referred to the first embodiment.

Referring to FIG. 8, a light emitting device package 100A may include a plurality of pits 120 in a cavity region 115 of a body 110A. A plurality of electrode layers 141 and 142 may be disposed on the surface of the body 110A. The body 110A may be formed of an insulation resin material, and the insulation layer may be removed from the structure of FIG. 1.

Here, the cavity 115 of the body 110A may be formed by an injection-molding process, or may be formed by an etching process of silicon material, but embodiments are not limited thereto.

The light emitting device 150A may be die-bonded to the first electrode layer 141 among the plurality of electrode layers 141 and 142, and may be connected to the second electrode layer 142 through a wire 152. The light emitting device 150A may have a structure in which electrodes are vertically disposed.

The plurality of electrode layers 141 and 142 may include second protrusions 145 on each pit 120, and first protrusions 144 formed in each pit 120 in a direction opposite to the second protrusions 145. The second protrusions 145 may be formed to protrude from each pit 120 by alternately applying a current in a forward and backward direction during a plating process and controlling the current size and density. A detailed description thereof will be substituted with those of the first embodiment.

Figure 9:
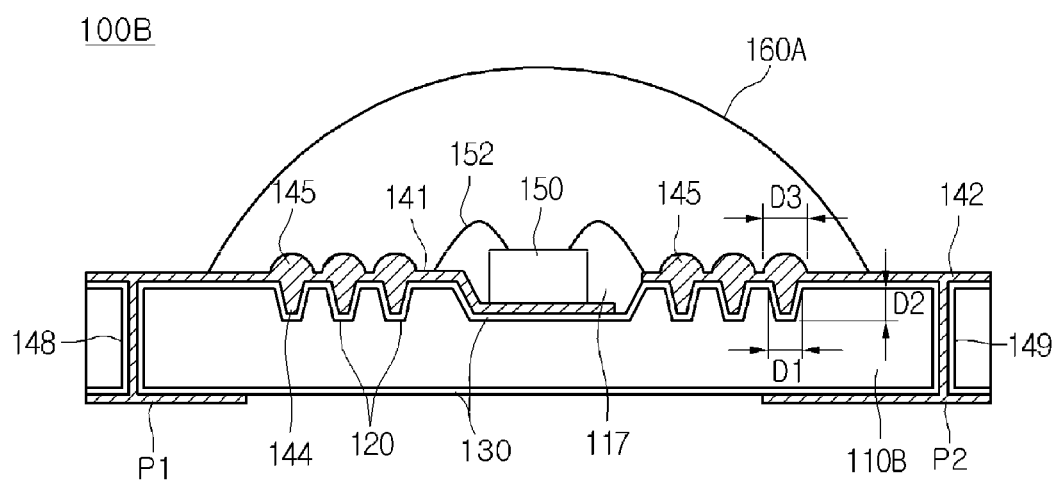
FIG. 9 is a side cross-sectional view illustrating a light emitting device package according to a third embodiment.

FIG. 9 is a view illustrating a light emitting device package according to a third embodiment. For explanation of the third embodiment, a detailed description of the parts identical to those of the first embodiment will be substituted with those of the first embodiment.

Referring to FIG. 9, a light emitting device package 100B may include via structures in a body 110B, and a cavity like in FIG. 1 may not be formed.

The light emitting device package 110B may include holes 148 and 149 substantially vertical with respect to the top surface and the lower surface of the body 110B. The light emitting device package 110B may include at least two holes 148 and 149, which are via structures connecting the top surface and the lower surface of the body 110B. Insulation layers 130 may be formed around the holes 148 and 149. First and second electrode layers 141 and 142 may be connected to lead electrodes P1 and P2 that are disposed under the body 110B through the holes 148 and 149. The lead electrode P1 and P2 may be electrically or physically spaced from each other, and may supply power.

A lens 160A may be disposed on the body 110B. The lens 160A may be formed of a light-transmitting material, for example, a molding member such as resin or glass. The lens 160A may be disposed on the light emitting device 150 to have a convex lens shape.

Second protrusions 145 of the electrode layer 141 and 142 may be disposed around the light emitting device 150, but embodiments are not limited thereto.

Figure 10:
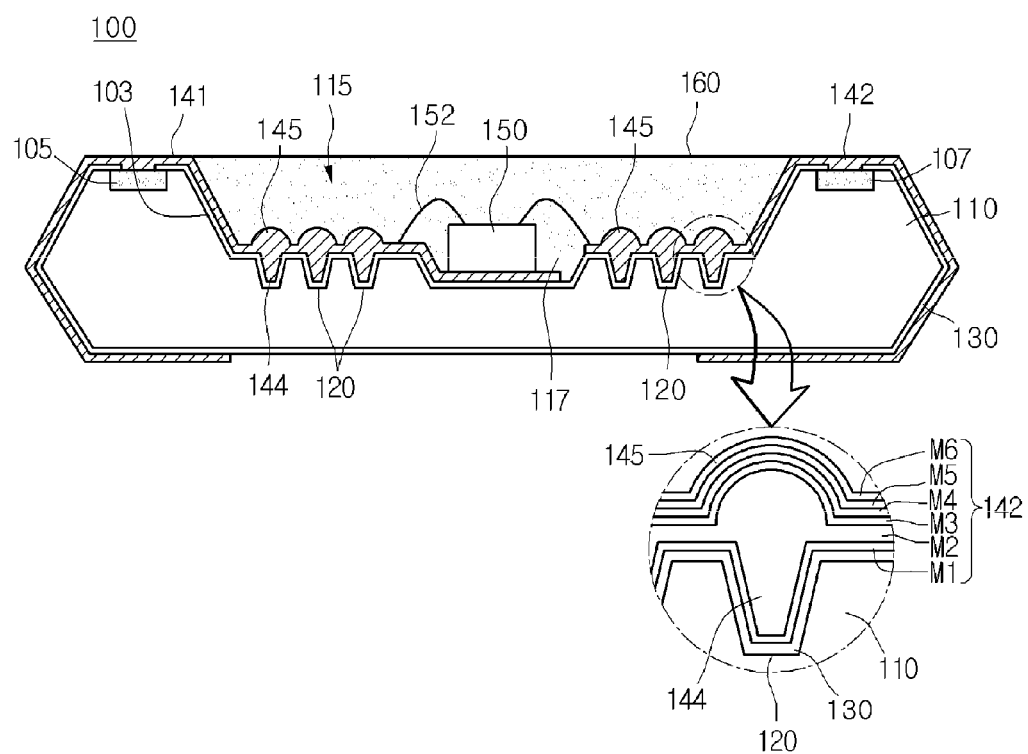
FIG. 10 is a side cross-sectional view illustrating a light emitting device package according to a fourth embodiment.

FIG. 10 is a side cross-sectional view illustrating a light emitting device package according to a fourth embodiment.

Referring to FIG. 10, at least one doped region may be disposed in a body 110. A structure in which first and second doped regions 105 and 107 are disposed will be described as an example.

The first and second doped regions 105 and 107 may be added with dopant having a polarity opposite to the polarity of the body 110. First conductive-type dopant and/or second conductive-type dopant may be selectively diffused or implanted into the first and second doped regions 105 and 107. A doped region added with dopant having the same conductive-type as the body 110 may be further formed in the doped region, but embodiments are not limited thereto.

When the body 110 is an N-type semiconductor, the first and second doped regions 105 and 107 may become a P-type semiconductor region doped with P-type dopant. The first doped region 105 may be electrically connected to a first electrode layer 141, and the second doped region 107 may be electrically connected to a second electrode layer 142.

The first and second doped regions 105 and 107 may be connected to the body through an N-P junction, which may be implemented with a Zener diode. The Zener diode may be inversely connected to the light emitting device 150, and may protect the light emitting device 150 from an abnormal voltage.

The first and second electrode layers may include a stack structure of a seed layer M1, a conductive layer M2, a barrier layer M3, a bonding layer M4, an adhesive layer M5, and a reflection layer M6.

The seed layer M1 may be disposed on an insulation layer 130. The conductive layer M2 may be disposed on the seed layer M1. A lower portion of the conductive layer M2 may be formed as a first protrusion 144 in a pit 120, and an upper portion of the conductive layer M2 may protrude from the bottom surface of a cavity 115. Accordingly, the depth of the pit 120 may be smaller than the thickness of the conductive layer M2, but embodiments are not limited thereto.

The barrier layer M3, the bonding layer M4, the adhesive layer M5, and the reflection layer M6 may be stacked on the conductive layer M2. The stack structure of the barrier layer M3, the bonding layer M4, the adhesive layer M5, and the reflection layer M6 may be stacked on the conductive layer M2 may protrude higher than the bottom surface of the cavity 115.

Figure 11:
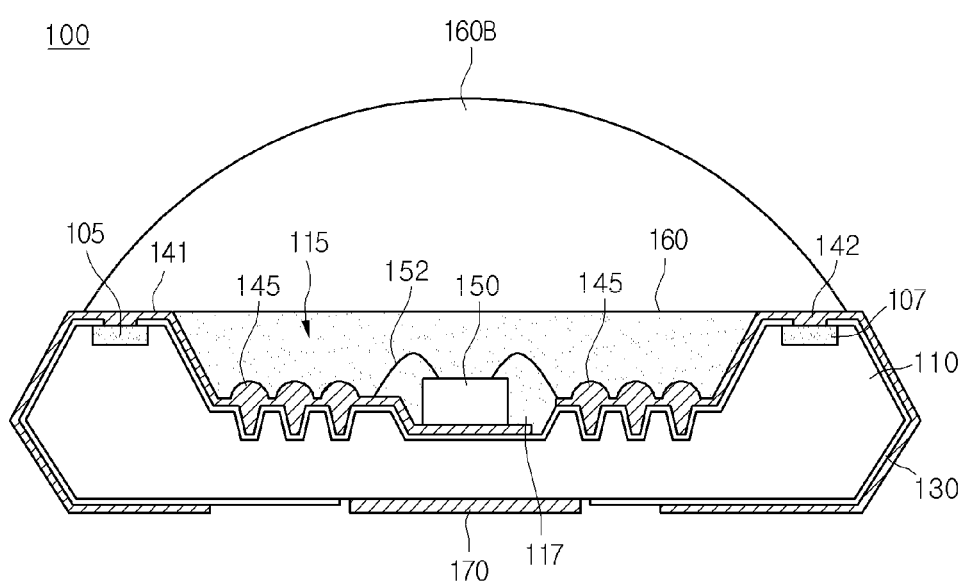
FIG. 11 is a side cross-sectional view illustrating a light emitting device package according to a fifth embodiment.

FIG. 11 is a side cross-sectional view illustrating a light emitting device according to a fifth embodiment.

Referring to FIG. 11, a heat-radiation frame 170 may be disposed on the lower surface of a body 110. The heat-radiation frame 170 may be disposed vertically corresponding to the lower surface of a light emitting device 150. The heat-radiation frame 170 may directly contact the lower surface of the body 110. An insulation layer 130 may be disposed between the heat-radiation frame 170 and the body 110, but embodiments are not limited thereto.

The area of the heat-radiation frame 170 may be greater than the area of the lower surface of the light emitting device 150.

Heat generated in the light emitting device 150 may be conducted to electrode layers 141 and 142 and the body 110. The heat conducted to the body 110 may be radiated by the heat-radiation frame 170.

The heat-radiation frame 170 may be electrically opened to the first and second electrode layers 141 and 142, and may contact the lower surface of the body 110.

A lens 160B may be disposed on the body 110, and may protrude in a hemispherical shape. The lens 160B may contact the top surface of a molding member 160, and may be disposed on the first and second electrode layers 141 and 142 that are disposed over the body 110, thereby preventing damage of the first and second electrode layers 141 and 142.

Although shown in a top-view type, the package according to the embodiment is implemented in a side-view type to show effects of improving the characteristics of heat-radiation, conductivity, and reflection. When the package is applied to indicating devices, lighting devices, and display devices that employ a light emitting device package of such a top-view or side-view type, the reliability can be improved by heat-radiation efficiency.

<Lighting System>

A light emitting device package according to an embodiment may be applied to a lighting system. The lighting system may include a structure in which a plurality of light emitting device packages are arrayed, and may include lightings, traffic lights, vehicle headlights, and electronic display boards.

Figure 12:
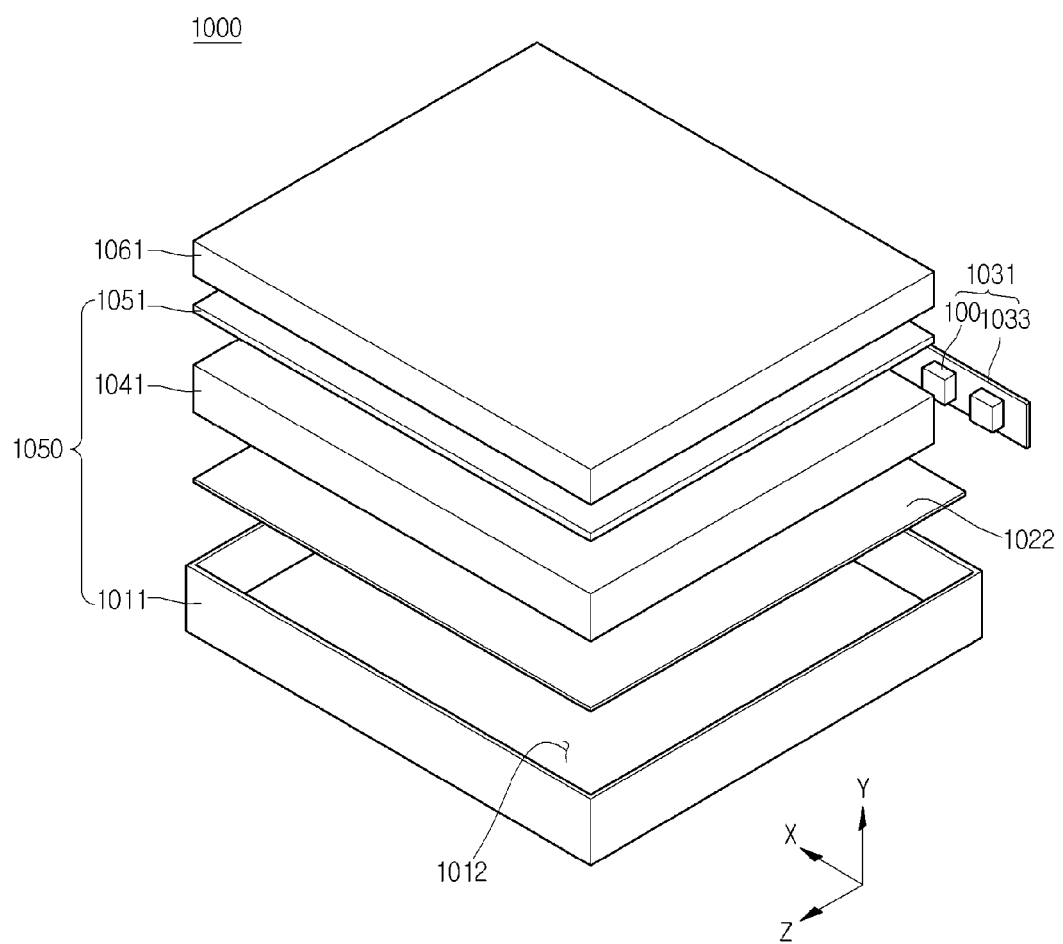
FIG. 12 is a diagram illustrating a display device according to an embodiment.
Figure 13:
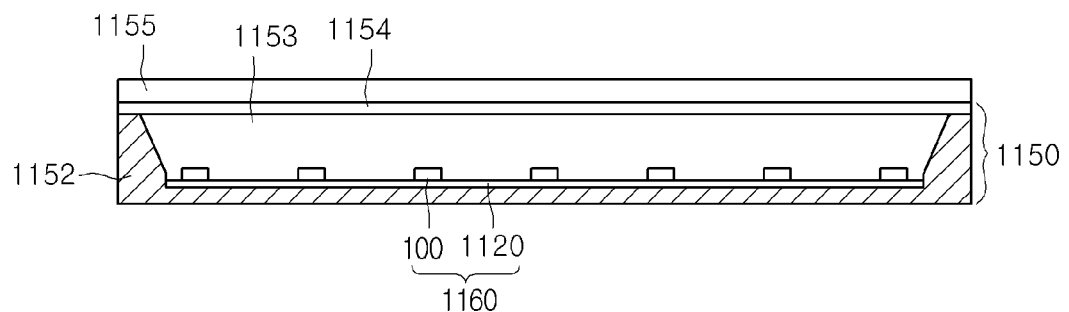
FIG. 13 is a diagram illustrating another display device according to an embodiment.
Figure 14:
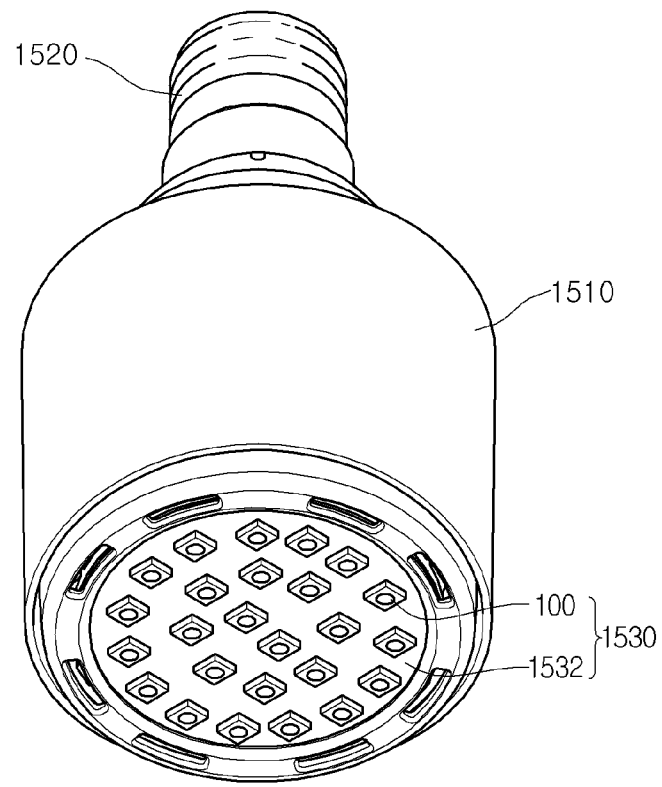
FIG. 14 is a diagram illustrating a lighting device according to an embodiment.

The lighting system may include display devices illustrated in FIGS. 12 and 13, a lighting device illustrated in FIG. 14, illumination lamps, signal lights, car headlights, electronic displays, and the like.

FIG. 12 is an exploded perspective view illustrating a display device according to an embodiment.

Referring to FIG. 12, a display device 1000 according to the embodiment may include a light guide plate 1041, a light emitting module 1031 providing light to the light guide plate 1041, a reflection member 1022 under the light guide plate 1041, an optical sheet 1051 on the light guide plate 1041, a display panel 1061 on the optical sheet 1051, and a bottom cover 1011 storing the light guide plate 1041, the light emitting module 1031, and the reflection member 1022; however, it is not limited to this.

The bottom cover 1011, the reflection sheet 1022, the light guide plate 1041, and the optical sheet 1051 may be defined as a light unit 1050.

The light guide plate 1041 serves to diffuse light for convergence to a surface light source. The light guide plate 1041 is formed with transparent material and, e.g., may include one of acrylic resin such as polymethyl metaacrylate (PMMA), polyethylene terephthalate (PET), poly carbonate (PC), cycloolefin copolymer (COC), and polyethylene naphthalate (PEN) resins.

The light emitting module 1031 provides light to at least one side of the light guide plate 1041 and ultimately acts as a light source of the display device.

At least one light emitting module 1031 is included, and it may provide light directly or indirectly at one side of the light guide plate 1041. The light emitting module 1031 includes a substrate 1033 and the light emitting device package 30 according to the above-disclosed embodiment. The light emitting device package 30 may be arrayed at predetermined intervals on the substrate 1033.

The substrate 1033 may be a Printed Circuit Board (PCB) including a circuit pattern (not illustrated). However, the substrate 1033 may include not only the typical PCB but also a metal core PCB (MCPCB) and a flexible PCB (FPCB), and it is not limited to this. In the case that the light emitting device package 30 is installed on the side of the bottom cover 1011 or on a heat radiating plate, the substrate 1033 may be eliminated. Herein, a part of the heat radiating plate may be contacted to an upper surface of the bottom cover 1011.

The plurality of light emitting device packages 30 may be installed on the substrate 1033 so that a light-emitting surface is separated from the light guide plate 1041 by a predetermined distance, and there is no limit for this. The light emitting device package 30 may provide light to a light-entering part, i.e., one side, of the light guide plate 1041 directly or indirectly, and there is no limit for this.

The reflection member 1022 may be disposed under the light guide plate 1041. The reflection member 1022 reflects the light incident to the lower surface of the light guide plate 1041 in an upward direction so that brightness of the light unit 1050 may be improved. The reflection member 1022 may be formed with, e.g., PET, PC, PVC (polyvinyl chloride) resins; however, it is not limited to this. The reflection member 1022 may be the upper surface of the bottom cover 1011; however, there is no limit for this.

The bottom cover 1011 may store the light guide plate 1041, the light emitting module 1031, and the reflection member 1022. To this end, the bottom cover 1011 may be provided with a storing unit 1012 having a shape of a box whose upper surface is open, and there is not limit for this. The bottom cover 1011 may be combined with a top cover, and there is no limit for this.

The bottom cover 1011 may be formed with metal material or resin material and may be fabricated using processes of press or extrusion molding. The bottom cover 1011 may also include metal or non-metal material having good thermal conductivity, and there is no limit for this.

The display panel 1061 is, e.g., an LCD panel, and includes transparent first and second substrates, and a liquid crystal layer between the first and second substrates. On at least one side of the display panel 1061, a polarizing plate may be attached; however, the attaching structure is not limited to this. The display panel 1061 displays information by the light which passes through the optical sheet 1051. The display device 1000 may be applied to various cell phones, monitors of notebook computers, monitors of laptop computers, and televisions.

The optical sheet 1051 is disposed between the display panel 1061 and the light guide plate 1041 and includes at least one translucent sheet. The optical sheet 1051 may include at least one of, e.g., diffusion sheet, horizontal and vertical prism sheets, and brightness enhancement sheet. The diffusion sheet diffuses the incident light. The horizontal or/and vertical prism sheet concentrates the incident light to a display region. The brightness enhancement sheet reuses lost light to enhance brightness. A protection sheet may be disposed on the display panel 1061, and there is no limit for this.

Herein, on the light path of the light emitting module 1031, the light guide plate 1041 and the optical sheet 1051 may be included as optical members; however, there is no limit for this.

FIG. 13 is a diagram illustrating a display device according to an embodiment.

Referring to FIG. 13, a display device 1100 includes a bottom cover 1152, a substrate 1120, an optical member 1154, and a display panel 1155. Herein, the above-disclosed light emitting device packages 30 are arrayed on the substrate 1120.

The substrate 1120 and the light emitting device package 30 may be defined as a light emitting module 1060. The bottom cover 1152, at least one light emitting module 1060, and the optical member 1154 may be defined as a light unit.

The bottom cover 1152 may be provided with a storing unit 1153, and there is no limit for this.

Herein, the optical member 1154 may includes at least one of the lens, light guide plate, diffusion sheet, horizontal and vertical prism sheets, and brightness enhancement sheet. The light guide plate may be formed with PC material or polymethyl metaacrylate (PMMA) material, and this light guide plate may be eliminated. The diffusion sheet diffuses the incident light. The horizontal or/and vertical prism sheet concentrates the incident light to the display region. The brightness enhancement sheet reuses lost light to enhance brightness.

The optical member 1154 is disposed on the light emitting module 1060. The optical member 1154 converts the light emitted from the light emitting module 1060 to the surface light source, or performs diffusing and concentrating light.

FIG. 14 is a perspective view illustrating an illumination device according to an embodiment.

Referring to FIG. 14, an illumination device 1500 may include a case 1510, a light emitting module 1530 installed to the case 1510, and a connection terminal 1520 installed to the case 1510 and provided with power from an external power source.

It is preferable to form the case 1510 with material which has good heat radiation characteristics. For instance, the case 1510 may be formed with metal material or resin material.

The light emitting module 1530 may include a substrate 1532 and the light emitting device package 30 according to the embodiment installed on the substrate 1532. The plurality of light emitting device packages 30 may be arrayed in a matrix form or may be arrayed being separated from each other at predetermined intervals.

The substrate 1532 may be an insulator where a circuit pattern is printed. For instance, the substrate 1532 may include the PCB, metal core PCB, flexible PCB, ceramic PCB, and FR-4 substrate.

The substrate 1532 may also be formed with material which efficiently reflects light, or its surface may be coated with color, e.g., white and silver, which efficiently reflects light.

At least one light emitting device package 30 may be installed on the substrate 1532. Each of the light emitting device packages 30 may include at least one Light Emitting Diode (LED) chip. The LED chip may include a light emitting diode of visible light such as red, green, blue, or white or a UV light emitting diode which emits Ultra Violet (UV).

A combination of various light emitting device packages 30 may be disposed in the light emitting module 1530 for obtaining color tone and brightness. For instance, for securing high Color Rendering Index (CRI), a white light emitting diode, a red light emitting diode, and a green light emitting diode may be combined and disposed.

The connection terminal 1520 may be electrically connected to the light emitting module 1530 to supply power. The connection terminal 1520 is screwed to be connected to the external power source in a socket method; however, there is no limit for this. For instance, the connection terminal 1520 may be formed as a pin shape to be inserted into the external power source or may be connected to the external power source by a wire.

A method of fabricating a light emitting device package according to an embodiment may include forming a plurality of pits at an upper portion of a body; forming an electrode layer including a seed layer and a conductive layer on the body, and a second protrusion on the pit; and disposing at least one light emitting device on the electrode layer.

According to embodiments, extraction efficiency of light emitted from a light emitting device can be improved by forming an electrode layer having a plurality of recess patterns through an electroplating process. Also, a process for forming an electrode layer having a recess pattern can be simplified, and the light efficiency of a package can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a body comprising a plurality of pits spaced apart from each other;
   a plurality of electrode layers on the body, the plurality of the electrode layers including first protrusions disposed in the pits and second protrusions protruding in a direction opposite to the first protrusions;
   a light emitting device on at least one of the plurality of electrode layers; and
   a molding member on the light emitting device,
   wherein the second protrusions are spaced apart from the light emitting device, and
   wherein each of the second protrusions is protruded on each of the pits in a vertical direction and is disposed on each of the first protrusions in a vertical direction.

2. The light emitting device package of claim 1, wherein the plurality of electrode layers are spaced from each other at a top surface of the body, and each of the electrode layers extends to a lower surface of the body.

3. The light emitting device package of claim 1, comprising an insulation layer between the body and each of the electrode layers, the body comprising a conductive material.

4. The light emitting device package of claim 1, wherein each of the second protrusions corresponds to each of the pits of the body, respectively,
   wherein each of the plurality of electrode layers includes the first protrusions and the second protrusions connected to each other.

5. The light emitting device package of claim 1, wherein a periphery portion of each of the pits has an inclined side surface.

6. The light emitting device package of claim 1, wherein at least one of the plurality of pits has a width of about 1 μm to about 30 μm.

7. The light emitting device package of claim 4, wherein a width of a lower end of the second protrusion of each electrode layer is greater than a width of an upper end of the first protrusion of a same electrode layer.

8. The light emitting device package of claim 3, wherein one of the electrode layers comprises a first region comprising a plurality of first metal layers; and a second region comprising the plurality of first metal layers and a plurality of second metal layers on the plurality of first metal layers.

9. The light emitting device package of claim 8, wherein the light emitting device is disposed in the first region of one of the electrode layers, and the plurality of pits and the plurality of second protrusions are disposed in the second region spaced apart from the first region.

10. The light emitting device package of claim 8, wherein the plurality of the first metal layers comprise:
    a seed layer on the insulation layer;
    a conductive layer on the seed layer;
    a barrier layer on the conductive layer;
    a bonding layer on the barrier layer,
    wherein the plurality of second metal layers comprise an adhesive layer on the bonding layer; and a reflection layer on the adhesive layer.

11. A light emitting device package comprising:
    a body including a cavity upwardly opened and a plurality of pits spaced apart from each other on a bottom surface of the cavity;
    an insulation layer on a surface of the body;
    a plurality of electrode layers on the insulation layer, the plurality of electrode layers including first protrusions disposed in the pits and second protrusions protruding in a direction opposite to the first protrusions;
    a light emitting device on at least one of the plurality of electrode layers; and
    a molding member on the light emitting device,
    wherein the second protrusions are spaced apart from the light emitting device, and wherein each of the second protrusions is protruded on each of the pits in a vertical direction and is disposed on each of the first protrusions in a vertical direction.

12. The light emitting device package of claim 11, wherein each of the pits has a depth lower than the bottom surface of the cavity.

13. The light emitting device package of claim 11, wherein the insulation layer and the plurality of electrode layers are disposed on an inside of each of the pits.

14. The light emitting device package of claim 11, wherein the plurality of electrode layers comprise a conductive layer comprising at least one of Cu, Al, Au, and Ag, and the conductive layer protrudes from the first protrusion in the pit to a portion of the second protrusion.

15. The light emitting device package of claim 11, wherein the first protrusion has a pillar shape in which an upper portion of the first protrusion has an area greater than an area of a lower portion of the first protrusion, and the second protrusion has a hemispherical shape.

16. The light emitting device package of claim 11, wherein a portion of the bottom surface of the cavity where the light emitting device is disposed is closer to a lower surface of the body than a portion of the bottom surface of the cavity where the pit is not formed.

17. The light emitting device package of claim 11, wherein one of the second protrusions of one of the electrode layers protrudes from a top surface of the electrode layer by a height of about 1 μm to about 30 μm.

18. The light emitting device package of claim 11, wherein the insulation layer and the plurality of electrode layers extend to a lower surface of the body through a hole disposed in the body.

19. The light emitting device package of claim 11, wherein the body comprises a silicon-based material.

20. A lighting system comprising:
- a plurality of light emitting device packages;
- a board on which the plurality of light emitting device packages are disposed; and
- an optical member on the board,
- wherein each of the plurality of the light emitting device packages comprise:
  - a body comprising a plurality of pits spaced apart from each other;
  - a plurality of electrode layers on the body, the plurality of electrode layers including first protrusions disposed in the pits and second protrusions protruding in a direction opposite to the first protrusions;
  - a light emitting device on at least one of the plurality of electrode layers; and
  - a molding member on the light emitting device,
- wherein the second protrusions are spaced apart from the light emitting device, and
- wherein each of the second protrusions is protruded on each of the pits in a vertical direction and is disposed on each of the first protrusions in a vertical direction.

* * * * *